United States Patent
Rijavec (10) Patent No.: US 7,068,398 B2
(45) Date of Patent: Jun. 27, 2006

(54) SYSTEM AND METHOD FOR EFFICIENT TILE GENERATION FROM COMPLEX RASTER DATA

(75) Inventor: Nenad Rijavec, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 1091 days.

(21) Appl. No.: 10/035,737

(22) Filed: Nov. 7, 2001

(65) Prior Publication Data

US 2003/0090706 A1    May 15, 2003

(51) Int. Cl.
*H04N 1/32*    (2006.01)
*H04N 1/41*    (2006.01)

(52) U.S. Cl. .......................... 358/426.01; 358/426.02; 358/426.04; 358/426.13; 358/426.14; 358/426.16; 358/462; 382/166; 382/232

(58) Field of Classification Search ............................... 358/426.01–426.16, 462; 382/232, 166
See application file for complete search history.

(56) References Cited

U.S. PATENT DOCUMENTS

| | | | | |
|---|---|---|---|---|
| 4,194,221 A | | 3/1980 | Stoffel ...................... 358/3.08 |
| 4,577,235 A | * | 3/1986 | Kannapell et al. .......... 358/462 |
| 5,469,161 A | | 11/1995 | Bezek .......................... 341/51 |
| 5,542,031 A | | 7/1996 | Douglass et al. .......... 358/1.15 |
| 5,544,290 A | | 8/1996 | Gentile ...................... 358/1.15 |
| 5,588,069 A | * | 12/1996 | Katayama et al. .......... 382/166 |
| 5,638,498 A | | 6/1997 | Tyler et al. ................ 358/1.18 |
| 5,682,441 A | * | 10/1997 | Ligtenberg et al. ......... 382/232 |
| 5,687,252 A | * | 11/1997 | Kanno et al. ................ 382/176 |
| 5,930,387 A | * | 7/1999 | Chan et al. ................. 382/166 |
| 6,137,914 A | * | 10/2000 | Ligtenberg et al. ......... 382/240 |
| 6,188,333 B1 | | 2/2001 | Cooper ......................... 341/51 |
| 6,192,155 B1 | | 2/2001 | Fan ............................. 382/243 |
| 6,304,606 B1 | * | 10/2001 | Murashita et al. ..... 375/240.24 |

FOREIGN PATENT DOCUMENTS

WO    WO 96/41308    12/1996

OTHER PUBLICATIONS

Bibliography on Source Coding/Data Compression, 6 pages.
Mitsuharu ARIMURA's Bookmarks on Source Coding/Data Compression, 13 pages.

* cited by examiner

*Primary Examiner*—Edward Coles
*Assistant Examiner*—Yixing Qin
(74) *Attorney, Agent, or Firm*—Jon A. Gibbons; Fleit, Kain, Gibbons, Gutman, Bongini & Bianco P.L.

(57) ABSTRACT

A system and method for accepting raster data from a Postscript or equivalent image data generator, identifying portions of the raster image which contain continuous tone data and linework data, dividing those portions into separate tiles and compressing the data within each tile by a compression method optimized for the type of image data within the tile. The compression algorithms are based upon conventional JPEG or LZW techniques, but enhanced to more efficiently process image data sets with large amounts of blank data.

33 Claims, 4 Drawing Sheets

SYSTEM AND METHOD FOR EFFICIENT TILE GENERATION FROM COMPLEX RASTER DATA

BACKGROUND OF THE INVENTION

1. Field of the Invention

This invention generally relates to the field of image compression, and more particularly relates to a method and system for compressing raster image data.

2. Description of Related Art

Digital data sets defining an image are often very large. The size of the raw data set describing an image, referred to as a raster data set, depends on the image size and resolution, as well as the colorspace used to represent the data and number of bits per color plane. The image size and resolution govern the number of pixels in the image, while the colorspace and the number of bits per color plane define the amount of data needed to describe each pixel.

A simple example is a bilevel image (i.e., where the image simply comprises a number of pixels which are each either on or off) which is a letter size image at a common print resolution of 600 dots per inch. Such an image contains over 33 million pixels that will require approximately 4 MBytes for uncompressed storage, given that each byte can describe eight pixels. Color images are commonly described using 8 or more bits per color. Techniques known as CIEL*a*b* and RGB colorspaces are used, respectively, with three color planes each, for device independent archival storage or for on screen image presentation. The CMYK (Cyan, Magenta, Yellow, Black) colorspace, which specifies four colorplanes, is often used for printing. Color images require between 24 and 32 bits per pixel, depending upon the inclusion of independent black color data, if the intensity of each color is represented with 8 bits per pixel. A letter size image with a resolution of 600 dots per inch requires approximately 96 MB of storage for a three-component colorspace and 128 MB for a four-component colorspace.

The size of a dataset defining an image impacts not only the storage of the image but also electronic communication of the image. The transmission of a dataset defining a highly detailed image that is to be transmitted to a high speed printer is a particularly difficult problem. Printers, which are capable of printing in excess of several hundred pages per minute, require that data for these images reach the printer with comparable speed. Data communication links are typically inadequate for the communication of the raw image data set to such high-speed printers. In order to communicate the image data to the high-speed printer, data compression is typically employed.

Compression algorithms that are used for image compression can be broadly classified into two categories, lossless compression and lossy compression. In a lossless algorithm, the decompressed image is an identical copy of the original image. As the name indicates, lossy algorithms introduce some data loss and the decompressed image is slightly different than the original image. The examples of commonly used lossless algorithms are ITU-TSS T6 Group 4 (for bilevel images) and Lempel-Ziv & Welch (LZW) for arbitrary data. The best-known lossy image compression algorithm is part of the Joint Photographic Experts Group (JPEG) standard.

The different types of compression algorithms are appropriate for different image types. Images may be classified into linework and continuous tone images (which may also be referred to as 'contone' images for the purposes of this specification). Linework images contain sharp edges and areas of high color contrast. Examples of linework images are rasterized text, pie charts and line drawings. Continuous tone images are distinguished from linework images by constantly varying color and a general lack (or relative unimportance) of sharp edges. Photographs are primary examples of continuous tone images.

Compression of a linework image via a lossy algorithm unacceptably degrades the decompressed image. An example of unacceptable degradation of a linework image compressed with a lossy algorithm (e.g., the JPEG algorithm) are artifacts and blurring in areas which neighbor sharp edges within the a linework. On the other hand, compressing a continuous tone image via a lossless compression algorithm results in very little data compression (e.g., common reduction in data size is 10% for compression of a continuous tone image via the LZW algorithm). The use of a lossless compression algorithm on a continuous tone image may actually cause the data set to expand (i.e., the compressed data set is larger than the uncompressed data set). Conversely, the lossless data compression algorithms preserve the quality of a linework image and also tend to have good data compression performance. The quality degradation of a decompressed continuous tone image that was compressed via a lossy algorithm is often imperceptible. Image data compression becomes more efficient if the image data is distinguished between continuous tone image data and linework image data and the data is compressed via an algorithm suitable for the type of image. This phenomenon is used in many image data rasterizers that are used in color printing, which process linework and continuous tone differently. While multiple color planes can combine in various ways, the images being carried in the CMYK colorspace (which refers to the four color planes used to encode color data: Cyan, Magenta, Yellow and Black) for printing are almost invariably carried in the planar format, where each color plane of the image is compressed separately.

Linework image data is often encoded using a run length algorithm or a variant of the LZW algorithm. The run length algorithm encodes each scan line in the image separately, by recording the number of pixels that have the same color intensity value. Alternatively, a run end algorithm can be used where the position of the last pixel in a "run" of pixels with the same color is recorded instead of the length of each run. A number of run lengths and run end compression forms are currently used, such as the MRLE runlength format used to communicate linework image data to the Xeikon high speed color printheads. Since the runlength/run end compression format record the changes in color on each scan line, the resulting datasets tend to be quite efficient for linework data.

The runend/runlength format serves as the intermediate format for the MMR family of algorithms, such as ITU-TSS T6 Group4, and is therefore heavily used in processing of bilevel data.

The LZW algorithm compresses an arbitrary stream of data (i.e., its use is not necessarily restricted to image data). The LZW algorithm operates by building a dictionary of code words that each represent a sequence of bytes. The dictionary is implicit, which is to say that the dictionary is never explicitly embedded into the compressed data stream. The dictionary of the LZW algorithm is dynamically constructed by the compressed data stream decoder as the encoded data is processed. The code words of typical LZW encoding techniques are 9–12 bits long. When the dictionary is full (i.e., all of the code words have been used), a special code, i.e., the CLEARCODE, is encoded. Upon receipt of the CLEARCODE by an LZW decoder, the code word dictionary is erased and the algorithm restarts.

In general terms, the encoding process of the LZW algorithm operates by building data strings and maintaining a dictionary of codewords to represent data strings that contain previously observed data patterns. These codewords are used to replace subsequent occurrences of those data strings. The algorithm maintains a currently active string. The currently active string always has a corresponding codeword in the dictionary. When the next character is processed from the un-encoded data input, a new string is considered, which comprises the currently active string with the current input character added to the end. If the dictionary already contains a code word describing the new string, that codeword becomes the current string and the algorithm advances to the next character. Otherwise, the codeword for the current string is output, a new codeword is assigned to the "new" string, which comprises the "current string" and the "current input character," and the "current string" is reinitialized to the current input character. The processing of the algorithm then proceeds to the next character. The LZW algorithm uses the character itself as a code word to encode a single-character string. The main computational cost in the LZW compression is checking whether the "new" string has an existing codeword. Modern LZW implementations use a hash table lookup to locate code words corresponding to input data strings. Each lookup entry is composed of the code ("prefix") that denotes the current string and the additional character.

Typical implementations of LZW encoders store these two entries (which fit into fewer than 20 bits) into a single integer value. The LZW algorithm is incorporated into a number of variations. All variations use the above described processing, but differ in their implementation details. One LZW encoding format often used for linework image compression is the TIFF LZW format. A similar format often used for image compression is the GIF LZW format, but that format restarts the compressor more often.

The PostScript LZWEncodeFilter uses a different variant of the LZW algorithm. The LZW algorithm is also used to compress arbitrary (non-image) data. For example, the "compress" utility shipped with Unix systems uses a variant of the TIFF LZW algorithm that results in the same compressed data length as the TIFF LZW algorithm, but which use different code words. The generality and simplicity of the LZW algorithm are both strengths and weaknesses in the algorithm. The strengths are obvious from the widespread use in manifold contexts. The weakness of the LZW algorithm is that for a particular application (say, compressing image data), the algorithm does not use all the available information to maximize the performance.

In most instances, an entire page to be printed does not entirely comprise only continuous tone or linework image data. It is inefficient to compress the whole output page for both data types, since that would incur both extra compression processing costs and, more importantly, extra decompression processing costs in the receiver. The common solution to this problem is to divide the output page into a set of rectangular tiles, wherein each tile contains different image data types. An example of such tiled image format is IOCA (Image Object Content Architecture) Function Set 45. The IOCA tiling scheme has been disclosed in U.S. patent application Ser. No. 09/305,258, entitled "Efficient Presentation of Images", filed on May 4, 1999 and U.S. patent application Ser. No. 09/571,333, entitled "Method and System for Efficient Transmittal and Presentation of Complex Images", filed on May 15, 2000 and both of which are incorporated hereinto in their entirety. Proper generation of a the IOCA FS45 datastream allows the receivers (in particular high speed color printers) to efficiently process the datastream at high speeds. This proper generation of the datastream, on the other hand, is a complex process and imposes high processing costs.

These prior art techniques integrate data compression processing with the image data generation functions to identify the nature of the image tile, i.e. continuous tone or linework, in order to efficiently compress the data for transmission. These techniques are ineffective when used in conjunction with raw image data that has already been generated.

Therefore a need exists for a set of process and system that ensure both reasonable processing throughput of a datastream generator and efficient generation of a compressed datastream when processing a pre-existing raw image dataset that comprises complex raster data.

SUMMARY OF THE INVENTION

According to a preferred embodiment of the present invention, a system and method for efficient tile generation from complex raster data comprises a method of for compressing image data which identifies a plurality of image tiles within a composite image data set, wherein the image tiles are identified based upon the value of a mask data value and a valid data value that is associated with each pixel within the image data set. The image data within each image tile within the plurality of image tiles is then characterized as being either linework image data or continuous tone image data. The image data within at least one image tile is then encoded by an algorithm, which is determined based upon the type of data within the tile.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings. Additionally, the left-most digit of a reference number identifies the drawing in which the reference number first appears.

DESCRIPTION OF THE PREFERRED EMBODIMENTS

The present invention, according to a preferred embodiment, overcomes problems with the prior art by dividing complex raster image data into portions, or image tiles, which each contain an image data group that defines either a section of continuous tone image data or a section of line work image data. These different portions, or tiles, are then compressed with an algorithm that is optimized for the type of data contained within that tile and that uses additional information that is available for each image color plane.

It is important to note, that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The example embodiments of the present invention perform tile generation and classification to identify the tiles within the composite image data that are generated by a raster image generator. Each of the identified tiles consists of one of the two different categories of output image data identified by the example embodiments of the present invention (i.e., line work and continuous tone data). Based upon the category of data comprising the image data group within the tile, the tile generation and classification algorithm then selects the appropriate compression algorithm to encode the image data that was identified within each tile. After the tiles have been identified, the example embodiments perform data compression using compression techniques that include several improvements to the known compression algorithms. These improvements utilize the additional information that is available to the data compressor in order to maximize performance.

The input to the system consists of a composite image data set that contains complex raster image data, possibly divided into a number of spatial strips. The composite image data received by the example embodiment further contains meta-data indicators which describe each pixel in the complex raster image data. The meta-data indicators received by the example embodiments include a valid bit and a mask bit. In the example embodiment, the valid bit contains the valid data value and the mask bit contains the mask data value, which are defined below. In the example embodiments, each colorplane is passed in a separate memory buffer. The colorplane buffers can be either interelaved (i.e., all color plane buffers for a strip passed together) or planar (i.e., all strips for a single color passed together before the next color is started). Strips may be specified out of order and strips that do not contain any data are usually not passed.

For each pixel in each colorplane, four values are specified: contone value, linework value, mask bit and valid bit. In the preferred embodiment, the image generator providing input image data to the example embodiments is the Adobe CPSI/IPMV (Configurable PostScript Interpreter), which specifies linework, continuous tone, mask and valid in turn for each scan line. It will be clear to those skilled in the art that the same information can be passed in many different ways.

Conceptually, linework and continuous tone images can overlay each other, such as in the case of text on top of the background image. This is handled in the output datastream of the example embodiments of the present invention by using transparency masks. One data type (Continuous tone image data in our example embodiments) is put on the bottom and the other data type (linework image data in the example embodiment) is combined with a transparency mask and placed on top. The transparency mask for a tile is a bilevel image with the same dimensions as the tile and is interpreted as follows: for each pixel where the transparency mask bit is equal to one, the receiver will print or illuminate the pixel from the tile containing the mask. If the transparency mask bit is equal to zero, the receiver will treat the pixel in the tile as transparent, and show the image data in the plane that is below it. This technique, which is well known in the art, allows overlaying rectangular images on top of one another and printing or illuminating an arbitrary selection of pixels from each.

For efficiency, the example embodiments do not include transparency masks with tiles that contain continuous tone image data, since they are placed on the bottom. Alternative embodiments of the present invention may generate transparency masks with continuous tone, for example, if selective transparency of images on the bottom was also desired.

The example embodiments of the present invention classify tiles into one of three categories—continuous tone, linework and bilevel. Bilevel tiles are a special case of linework tiles that contain only black plane data and where all the data values are either zero or 255 (i.e., full saturation). The example embodiments process linework and bilevel tiles in a similar manner, except that different compression algorithms are used and different colorspaces are indicated in output.

Figure 1:
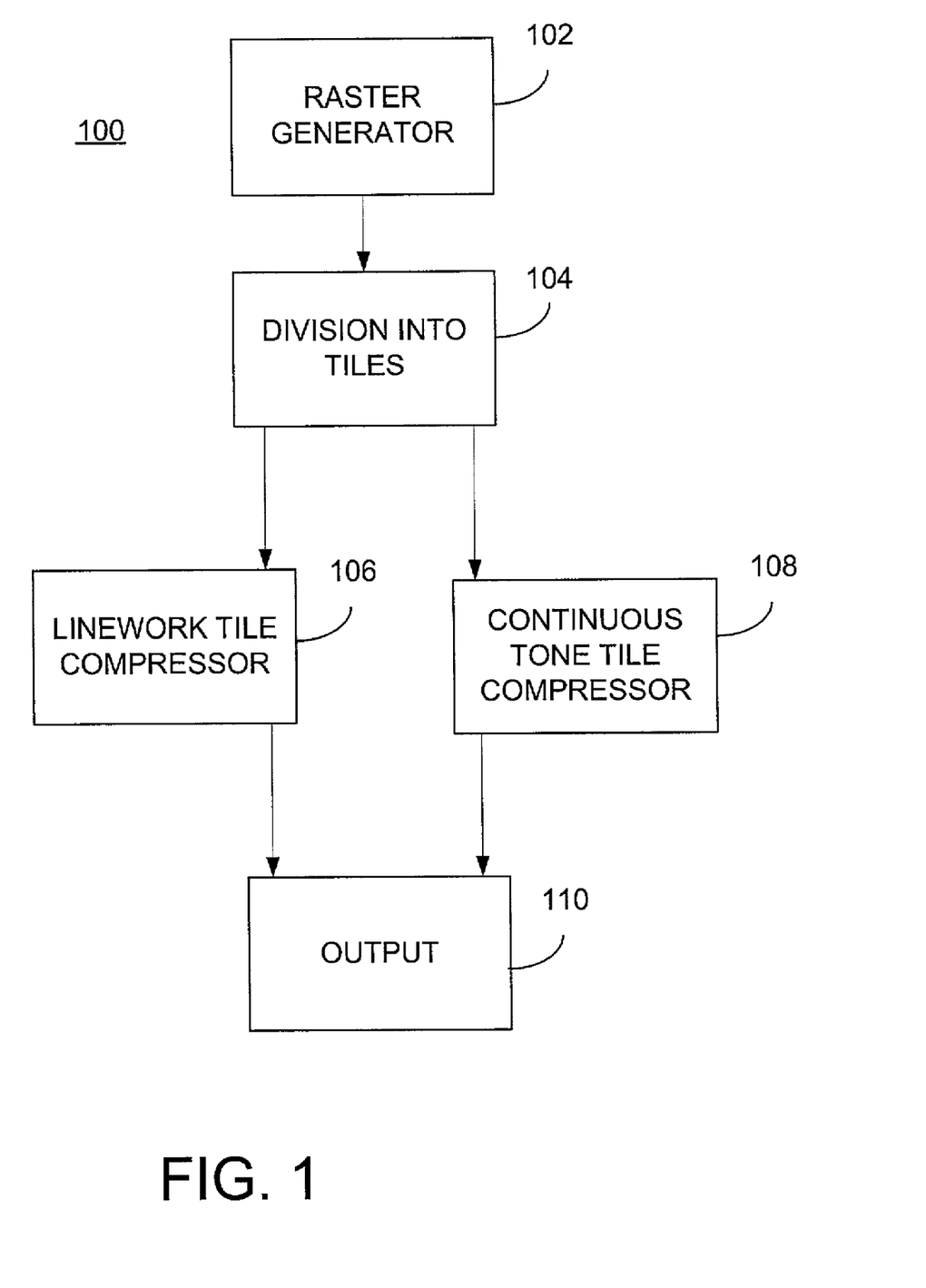
FIG. 1 is a block diagram illustrating a system for efficient tile generation from complex raster data in accordance with a preferred embodiment of the present invention.

According to a preferred embodiment of the present invention, as shown in FIG. 1, an image compression system 100 comprises a raster generator 102, which develops the image data in raster format. In the exemplary embodiment the raster generator is a conventional Postscript data format generator. Embodiments of the present invention may also incorporate different image generators that create image data that is compatible with the processing described in this specification. The postscript data generated by the raster generator 102 of the example embodiment produces image data, which contains two additional bits of meta-data for each pixel in each color plane of the image data. Each pixel in each color plane produced by the raster generator 102 of the exemplary embodiment has an associated 'valid' bit and an associated 'mask' bits. The valid bit indicates whether the block contains any data at all. If no data is contained in the block the valid bit is cleared. The mask bit indicates whether the pixel is part of an image that is characterized as a continuous tone image or a linework image. It is obvious that the following processing will work with any image generator that identifies whether pixel data contains data and whether that data is part of a continuous tone or linework image.

The example embodiment processes the individual color planes of the composite image data set, which contains a set of raster image data, that is produced by the raster generator 102. The image compression system 100 contains a division into tiles processor 104, which divides the raster data, produced by the raster generator 102 into a number of tiles. A tile is the rectangular subsection of the entire image. In the example embodiment of the present invention, the tiles are characterized as either containing continuous tone or linework data. The division into tiles processor 104 of the illustrated embodiment includes an image tile identifier and a tile data characterizer. The image tile identifier identifies the image tiles within the composite image data set and the tile data characterizer characterizes the data as either continuous tone or linework image data, as is described herein. Once the image data is divided into tiles, the data is transferred to a tile data encoder, which, in the example embodiment is either the line work tile compression block 106 or the continuous tone file compression block 108, depending upon the type of data within the tile. These compression blocks perform the appropriate compression based upon the type of data in the tile. Once the tile is compressed the tile is produced at output 110.

Figure 2:
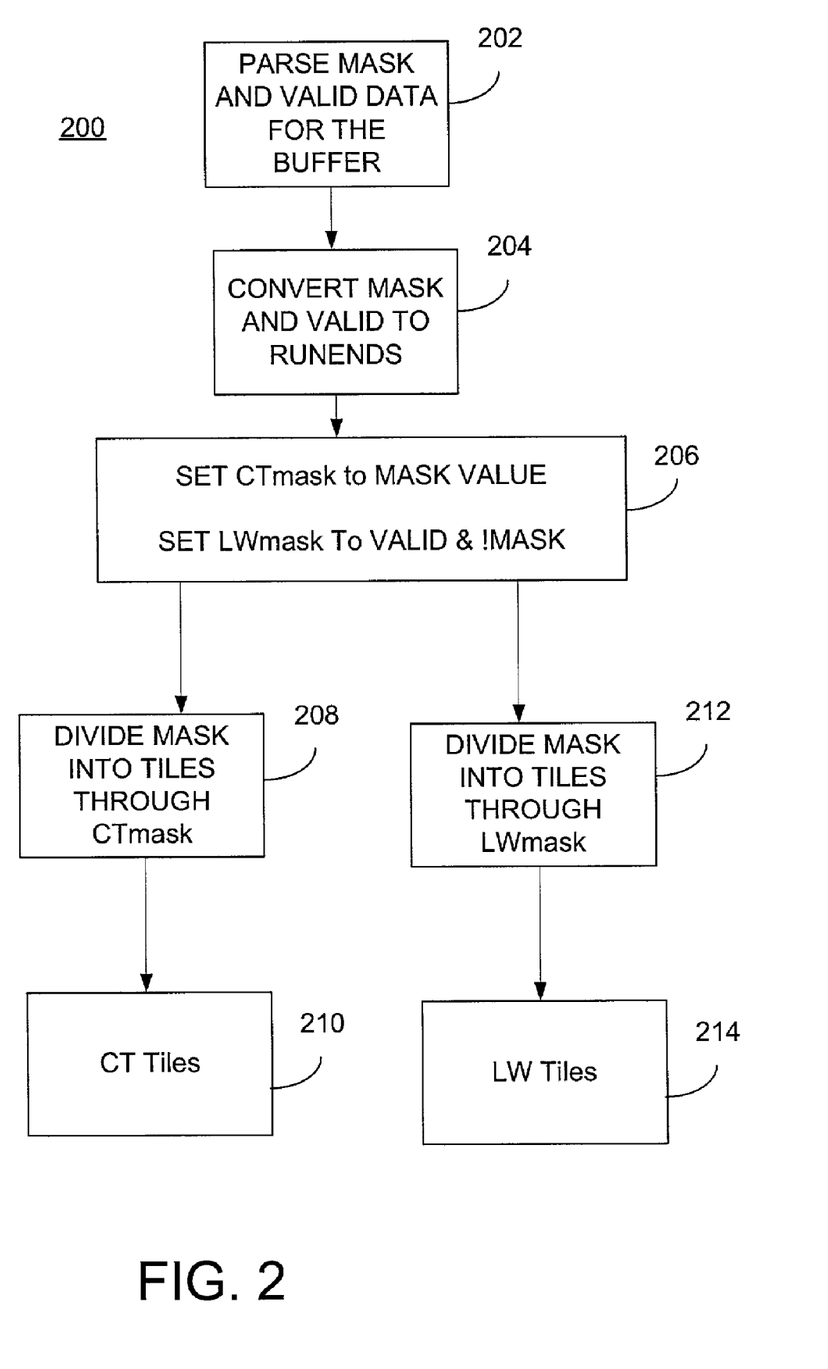
FIG. 2 is a detailed processing block diagram showing the division into tiles processing in the system of FIG. 1, according to a preferred embodiment of the present invention.

The buffer division processing 200 performed by the division into tiles processor 104 is shown in FIG. 2. The inputs into this processor are the meta-data associated with the image data, namely the mask bit and valid bits, that are associated with each pixel within the image buffer. The processing of the buffer division processing 200 begins in step 202 and prepares for processing the meta-data that relates to the raster image. Once the meta-data is prepared, the processing continues with step 204, wherein the mask and data bits are converted into runend format by the composite image data set encoder. The runend data format, which is known to practitioners in the relevant arts, is an encoding format that functions well to encode data that contains long sequences of the same value. The runend format utilized in the example embodiment compresses each scan line separately. The processing of the example embodiments assigns a sequential address within each scan line to each pixel in the scan line. In the format used in the example embodiment, the pixels are numbered starting with 1, while 0 denotes a dummy position that is used to indicate that the first actual pixel in the scan line is black. Runend formatting of the data performed within step 204 comprises processing the mask and data values within the image buffer to identify contiguous data locations that are equal to the same data value. The data encoding in runend format then stores the data value and the address of the data buffer at which that contiguous data sequence ends. The next sequence of data is similarly encoded until the entire buffer, or scan line in the illustrated embodiment, is encoded. As an example, a buffer which contains a sequence of five zeros, followed by eight ones and four zeros is encoded as indicating value zero runs through address five, value one then runs through value thirteen (i.e. it started at address six and runs through address thirteen) and the value zero then continues through address seventeen. The runend data format used by the example embodiment encodes data in blank/nonblank data run pairs by starting with a blank run and ending with a non-blank run. Some runs in this embodiment, including the first and last data runs, may have zero length.

The runend data format is similar to run-length encoding, but which encodes the length of equal value data in the data stream. Alternative embodiments of the present invention may similarly encode data utilizing the run-length format.

After the valid and mask data are encoded into runend format by the composite image data set encoder, the identify type processing block 206 generates two additional data bits for each pixel. The identify type processing block 206 generates and sets the CTmask data bit to the value of the mask data bit. These bits serve the function of identifying the image data pixel as continuous tone data. The identify type block 206 then sets the LWmask bit to the logical AND of the valid and inverse of the mask bit. A LWmask bit which is set identifies the image data pixel as linework data. The example embodiment of the present invention sets the CTmask bit for a pixel to a value of false, or equal to zero, if the corresponding pixel contains continuous tone data with line work data on top of the continuous tone data. Once the image data in the end run format has been characterized as continuous tone or line work data, the processing divides the data into continuous tone and linework tiles. The divide mask into continuous tone tiles processing block 208 identifies tiles, which contain continuous tone data by examining the CTmask bit for each pixel and outputs continuous tone tiles in the continuous tone tile output block 210. The divide mask into linework tiles processing block 212 identifies tiles which contain linework image data by examining the LWmask bit for each pixel and outputs those tiles in the line work tile output block 214.

The division of the image into tiles is based on examination of the transparency mask. The processing of the preferred embodiment identifies tile regions that cover all areas of the image that contain transparency mask bits that are set to a value of true, which may also be referred to as being equal to one. Some image data will allow tiles to be identified directly from the transparency mask data, such as the case where the mask bits are equal to one for a rectangular area. Other image data, e.g., where the mask bits are equal to one in a non-rectangular geometric area, require further processing to efficiently identify and classify the rectangular image data tiles. An example of image data which requires further processing are text data, which has transparency bits equal to one where the letters appear and are equal to false or zero to indicate the spaces that are within the letters. The example embodiments include processing which precludes erroneous identification of different tile regions from scan line to scan line.

The processing of the example embodiments aggregates data defining multiple scan lines into a divisions buffer. The division buffer of the example embodiment contains a storage location for each pixel in a single scan line and is encoded in an runend format. The division buffer is initialized so that each location is equal to false or zero. The image data is processed by adding each new scan line into the division buffer by performing a logical-OR of the next scan line with other scan lines previously aggregated into the division buffer. This results in the division buffer having a location equal to one for every column that contained a value of one in any scan line aggregated into the buffer. This technique removes the high frequency noise from the data used for division and allows larger tiles to be efficiently identified.

Figure 3A:
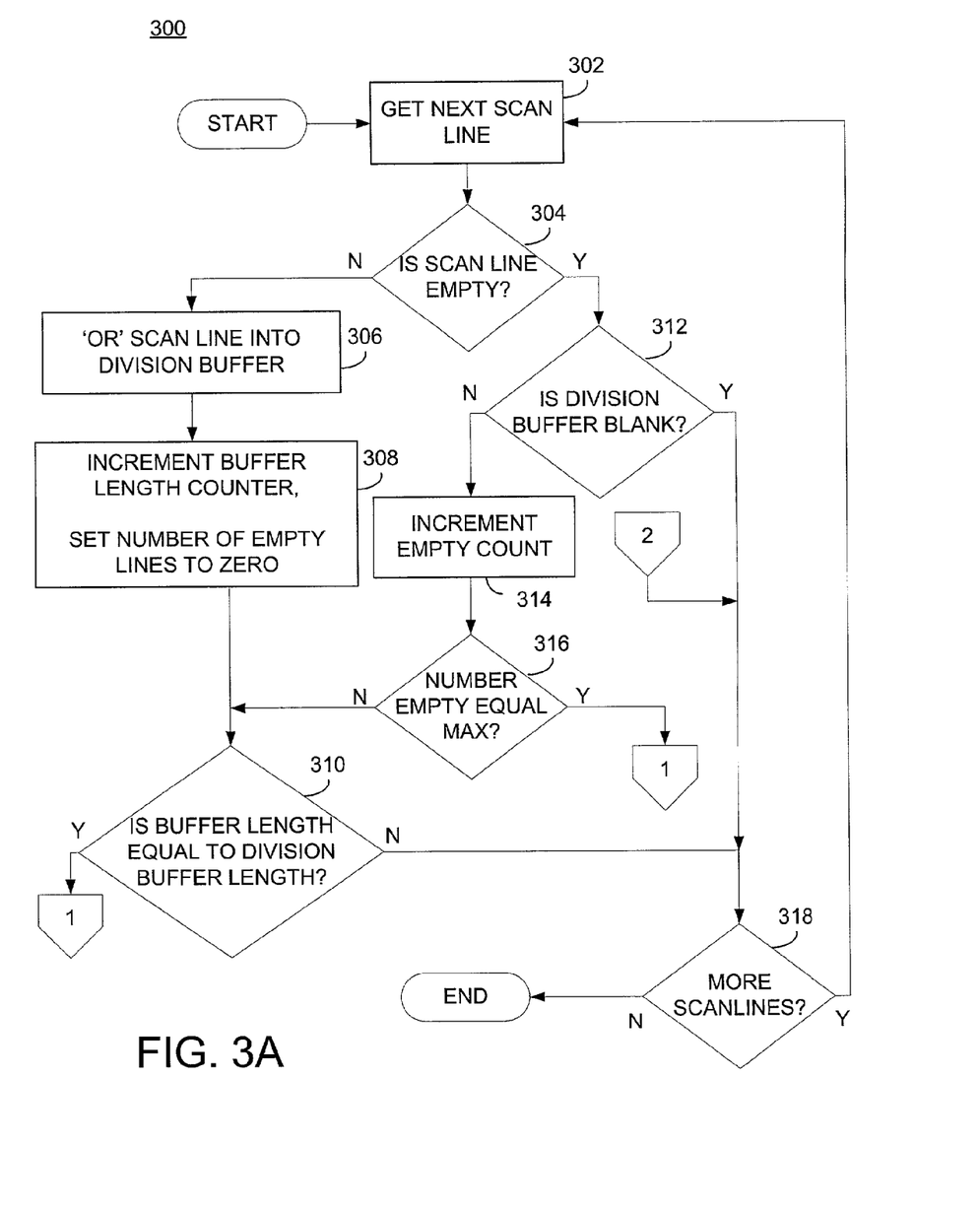
FIG. 3A and FIG. 3B are an operational flow diagram illustrating the processing performed by the linework tile compressor of FIG. 1, according to a preferred embodiment of the present invention.
Figure 3B:
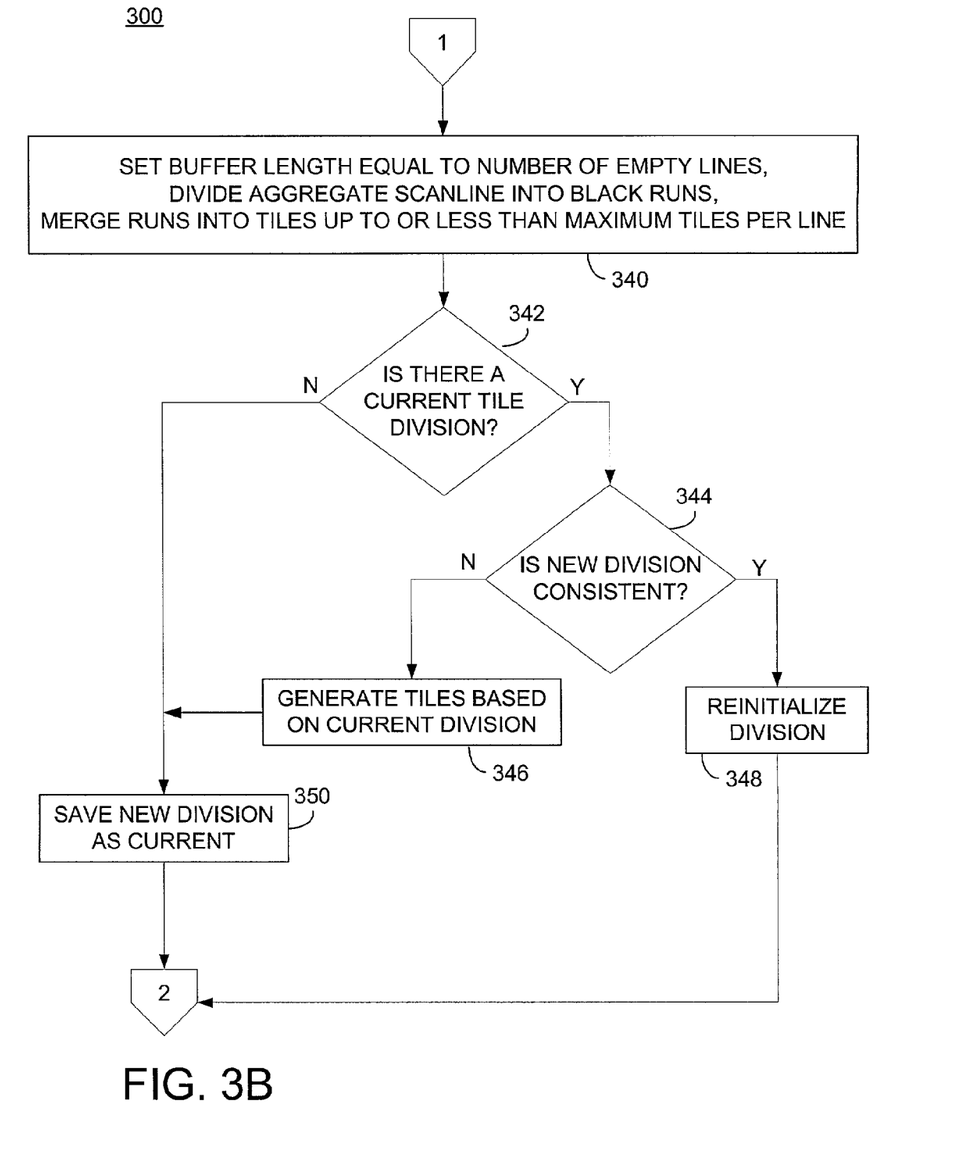

The divide masks into tiles processing 300, which is performed by the divide mask into tiles processing block 104, is illustrated in FIG. 3A and FIG. 3B. The divide mask into tiles processing block 104 operates on the mask data bits which have been converted into an runend format. The initial processing step operates on the next scan line, which is initially the first scan line, in step 302. The processing of step 304 determines, through examination of the mask data bit for each pixel in that scan line, if there is any data within the current scan line or if the scan line is empty. If the scan line is not empty, i.e., there is data within the line, the mask data is combined into the division buffer in step 306 through performing a pixel-by-pixel logical-OR operation with each pixel of the new scan line and the corresponding pixel in the division buffer. The corresponding pixels for purposes of accumulating scan lines in the division buffer are the pixels which are in the same column of each scan line being accumulated into the division buffer. After the scan line is has been combined, or aggregated, into the division buffer, step 308 is performed wherein a counter value that records the "length of the buffer" is incremented to maintain the count of the number of scan lines which have been aggregated into the division buffer. The number of empty contiguous lines is set to zero since the processing has encountered a non-empty scan line. The processing then continues with step 310 to determine if the buffer length counter, which indicates the number of scan lines aggregated into the division buffer, is equal to the maximum value as is set by the system configuration. The processing of step 310 and subsequent steps is described below.

If the processing in step 304 determines that the scan line is empty, the processing advances to step 312 to determine if the division buffer is blank. The division buffer is blank if no scan lines have been aggregated into the division buffer. If the division buffer is blank, the processing advances to step 318 to determine if more scan lines remain. If no scan lines remain as is determined in step 318, processing for this plane of the image ends. If scan lines remain to be processed, processing returns to step 302 to process the next scan line.

If the processing of step 312 determines that the division buffer is not blank, the processing advances to step 314 where a counter is incremented that reflects the number of empty scan lines that have been encountered since the beginning of aggregation of data, along with associated meta-data, into the current division buffer data structure. If the empty scan line count is determined, in step 316, to be equal to a maximum value of empty scan lines which can be aggregated into a division buffer, as determined according to the configuration of the system, processing advances to step 340 as shown in FIG. 3B. If the processing of step 316 determines that the empty scan line count is not equal to maximum value, the processing continues with step 310.

The processing of step 310 determines if the length of the division buffer, i.e. the maximum number of scan lines which can be aggregated into the division buffer is equal to the buffer length, which indicates the number of scan lines currently aggregated into the division buffer and which is incremented as each scan line data is aggregated into the division buffer. The length of the division buffer is determined by the configuration of the system. If the buffer length is not equal to the division buffer length, the processing continues with step 318 to determine if there are more scan lines to process. If the buffer length is equal to the division buffer length, processing continues with step 340 as shown in FIG. 3B.

The illustration of the divide masks into tiles processing 300 is continued in FIG. 3B. The processing of step 340 sets the counter indicating the length of the division buffer to the number of empty scan lines as determined by processing the scan lines combined into the division buffer. The processing of step 340 in the example embodiment further identifies tiles within the division buffer by analyzing the aggregate meta-data contained in the division buffer. The divide aggregate scanline into black run processing divides the aggregate scan lines contained in the division buffer into runs of pixels with are to be printed and runs which have not print data. The term "black" in this context is used to refer to a pixel with any level of pigmentation, and not just pixels that are truly black in color. A "black" pixel in this context simply means the pixel contains non-blank data. A run is a contiguous set of bits (or pixels) that have the same value. An example of a run is a string of data bits each set to a value of one, which indicates that the pixels that corresponds to those bits are to be printed. Another example of a run is a set of continuous image data bits that are all set to false or zero to indicate that the pixels associated with those bits are not to be printed. The processing of step 340 then merges the runs of image data, which contain non-blank data into tiles. This step identifies a set of tiles, referred to as the new tile division, that are present in the division buffer based upon an aggregation of scan lines that includes the most recent scan line. The processing of step 340 will merge the non-blank data runs into a number of tiles that is less than a maximum number of tiles per scan line, as is set by configuration of the system.

The processing of the example embodiment divides the image data in each division buffer into one or more tiles. The processing within step 340 develops a list of data tile ranges, which is referred to as a tile division. The tile division is a list of ranges within an accumulated division buffer that are determined to contain data. Development of the tile division data set does not modify the image data itself but merely results in the establishment of a set of tile range definitions. A tile division defines the width and horizontal placement of each identified tile within a set of scan lines that were accumulated in a division buffer. For example, a tile division could define three tiles within the three column ranges of 120–256, 2004–3800 and 4096–4100. This would result in establishing that all the other pixels column ranges are blank. The individual scan lines that were aggregated into the division buffer may contain runs of pixels which do not contain data, since the data in the division buffer is an aggregation of multiple scan lines. Since each division buffer covers a number of scan lines, each such range naturally corresponds to a tile in the image.

Processing then advances to step 342, wherein the processing determines if the there is a current tile division, i.e. a tile division definition that had been determined during the processing of the previously accumulated and presently processed division buffer. If the processing of step 342 determines that there is a current tile division, the processing advances to step 344 to determine if the new tile division, which is the tile division determined by the processing of the presently accumulated division buffer, is consistent with the current tile division. The new tile division is determined to be consistent if the current tile division and new tile division are the same or sufficiently similar as is defined below. If the new division is much different and determined to not be similar, the processing of the example embodiment advances to step 346 wherein the range of scan lines for the tiles described by the current division is terminated. The tile lengths are based upon the number of scan lines over which the current tile division is applicable, which may include several division buffers if the "new" tile divisions that were calculated during the prior processing of successive division buffers identified tile divisions that were sufficiently similar.

The processing of step 344 in the example embodiment compares the runs of pixels with data in the current tile division, based upon the previous (and possibly prior) division buffers and the new tile division which is the tile division calculated for the presently accumulated division buffer. In the example embodiment, tile divisions are considered to be consistent if all of the runs of pixels that contain printable data in the presently accumulated division buffer are also present in the current tile division. In the case where the two divisions match in that manner, the current tile division may be said to contain the tile divisions present in the new tile division. It is clear that other criteria may also be used to determine consistency between the current division buffer and the new division buffer. Alternative embodiments may establish a threshold of pixels which contain data in the new tile division that are not present in the current tile division. If the new tile division contains a small number of pixels that contain data in addition to the pixels that contain data in the current division buffer, the current division buffer may be modified or adjusted to also include these small number of pixels. This modification may be made by performing a logical-OR of the new tile division and the current tile division to effectively add the tile regions of the new tile division to the current tile division. These embodiments retain the current tile division over the image scan lines that had been previously processed, and increase the length of the tiles in the current scan line to include, at least, the presently accumulated division buffer. This alternative processing may continue for multiple division buffers which have new tile divisions that differ only slightly from the current tile division and thereby extends the current tile division over those multiple division buffers.

If the new division is consistent, i.e., it is the same or only slightly different from the current tile division, the current tile division is retained or the new tile division may be used to slightly modified the current tile division. In this case, the tile division developed for the previously processed division buffers is retained for the scan lines contained within this division buffer. The new tile division is then reinitialized for the next iteration of division buffer accumulation and analysis. The processing then continues with step 318 as shown in FIG. 3A.

If it is not determined that there is a current tile division in step 342, or after the processing of step 346, the processing of step 350 is performed to save the new tile division as the current tile division for the next processing iteration. The processing then continues with step 318 as shown in FIG. 3B.

Compression of Data Within Each Tile

Once the image data have been divided into a number of tiles according to the type of image data, the data within each tile is compressed through the use of an encoding algorithm to compress the quantity of data contained within the tile. The encoding or compression algorithm is selected according to the type of data that was determined to be contained within each tile. Image tiles containing continuous tone data are compressed in the example embodiment through the use of a modified JPEG algorithm. Linework image tiles in the example embodiment are compressed with an LZW compression algorithm that is modified to use the mask and valid data bits within the image data to accelerate the compression processing.

Compression of Continuous Tone Image Data

Continuous tone image tiles are compressed in the example embodiment through the use of a conventional JPEG compression algorithm, which is modified to identify blank continuous tone image data. Each color layer of the image in the example embodiment is independently processed and compressed. The JPEG algorithm performs efficient compression of continuous tone data but a tile of continuous tone data with no data in a particular color level may be more efficiently processed by simply noting the lack of data and encoding a blank continuous tone tile. If the image tile has been characterized as containing continuous tone data, the example embodiment processes the data with a blank image detector. The blank image detector of the example embodiment determines if the image data contains all zero values. If the blank image detector detects continuous tone data that contains only zeroes, the example embodiment utilizes a blank image data producer which generates the encoded data by producing pre-computed values instead of executing the actual encoder processing. Standard JPEG Huffman tables are used in the example embodiment. Alternative embodiments can similarly use arbitrary tables. Embodiments can also be realized that use special tables containing only zero values.

A blank or empty image is defined as an image where all the pixel values are zero. The JPEG compression algorithm operates on 8×8 blocks of pixels. In the JPEG algorithm, a Discrete Cosine Transform (DCT) is applied to each block, the values computed by the DCT are quantized and these values are then entropy coded. In a baseline Huffman JPEG encoding, the final entropy codes can be produced without actually running the algorithm. There are three parts to the generated entropy coded JPEG datastream produced by the example embodiment of the present invention: namely startup, steady state and finish.

In the conventional JPEG encoding of pixel data blocks, the zero-frequency coefficient produced by the DCT transformation is treated differently from the coefficients for non-zero frequencies. The zero frequency coefficient of the first block is itself entropy coded in an entropy-coded segment. The entropy coding for each subsequent pixel data block then entropy codes the difference between the zero frequency coefficient value in the preceding block and the zero-frequency coefficient value of the current pixel data block. A blank image has several characteristics, which may be exploited for improvement in processing efficiency. The DCT processing of a blank image produces coefficients for non-zero frequency, which are all equal to zeros, since the image has no intensity changes from pixel to pixel. The zero frequency coefficient of the first pixel data block is nonzero, but because all of the blocks are identical (i.e., blank), the differences between the zero frequency coefficient values are all equal to zero. These characteristics result in entropy codes for the first block that are different than the entropy codes for all of the remaining blocks.

Given a particular set of Huffman tables, a bit pattern can be precomputed for the first pixel data block in the image and then for of all the other pixel data blocks in the image. In general, the number of bits needed to encode a pixel data block is not evenly divisible by eight. Pixel data blocks within blank images are often encoded in less than eight bits. The datastream produced by the example embodiment that contains the entropy-coded data is represented as a sequence of bytes that are each 8 bits in length.

The processing of the blank image data producer of the example embodiment combines pixel data blocks so as to develop encoded data. The encoded data is more efficiently stored in eight bit bytes than in a bit-oriented format. The definition of the pixel data block combinations used by the example embodiment is as follows. Let N be the number of bits that are used to encode the first block and let M be the number of bits used to encode any other block in the image. The processing of the example embodiment assumes that M is not a multiple of eight. Then, there exist a pair of numbers K and L such that the quantity N+KM and the product LM are evenly divisible by eight.

This means that the startup segment of the encoded data stream produced by the example embodiment for a blank, continuous tone image data set encode K+1 blocks and each steady state cycle of the data output encodes L blocks. In the case of a blank image which contains a total of W blocks to be encoded, setting E=(W−K−1)%L, where "%" operation indicates the modulus operation, E represents the number of blocks that must be encoded in the finishing part of the processing. The finishing sequence of the encoded datastream is generated by concatenating the encoding bits of the E blocks, left aligning them and then padding with "1" bits until the byte boundary.

In the example embodiment, the start byte sequence is precomputed, as is each "cycle", meaning the code sequence for L blocks that can be encoded using a set of bytes, without any leftover bits. The finish sequences assuming E is 1, 2, . . . L−1 are also precomputed in the example embodiment. To encode an image, the algorithm of the example embodiment first outputs the start sequence and stores the fact that it encoded K+1 pixel data blocks. The algorithm then cycles through the steady state, outputting codes for L pixel data blocks in turn, until less than L pixel data blocks remain to be encoded. The number of remaining blocks, which is represented by E, and therefore the end of the encoded datastream are finished by outputting the precomputed byte sequence for the particular value of E.

The example embodiment of the present invention uses standard Huffman tables and when encoding a blank continuous tone image dataset, uses a value of K equal to zero, a value of L equal to four and the startup byte sequence is 0xf9 0xfe (the startup sequence contains just the initial block, which is encoded using two bytes). The steady state cycle encodes four blocks using three bytes: 0x8a 0x28 0xaf. There are 4 possible finish sequences for the entropy coded segment:

0xbf—for E=0
0x8a—for E=1
0x82 0x2b—for E=2
0x8a 0x28 0xaf for E=3

Compression of Linework Image Data

The preferred embodiment utilizes an LZW compression algorithm, which has been modified to incorporate into the data compression process the mask data bit that is available in the image data. The example embodiment utilizes an LZW data encoder, which is based upon the TIFF LZW algorithm.

In the processing performed by the example embodiment of the present invention, pixels that have their transparency mask is set to zero, as indicated in the runend formatted data, are not included in further image processing. Pixels that have their transparency mask set to zero, do not have to be read from the image because they are known to be blank. Such blank pixels may be represented in the input to the data compression algorithm by a zero by simple reading of the mask bit value. Other embodiments may represent blank pixels using any arbitrary value suitable to the data compression processing. Linework images, especially those that are computer-generated, usually contain a lot of white space (i.e., pixels which contain a data value of 0x00). In addition, there are often a number of entire scan lines within this image data, which are blank, i.e. all pixels in the scan line contain the data value 0x00. The example embodiment uses an extension of the LZW algorithm to recognize and specially process such blank pixels and blank scan lines to increase the speed of data compression processing. The LZW algorithm extension uses the data in the transparency mask along with the above assumptions concerning the amount of blank data commonly present in linework images to increase the processing speed of linework image compression. The compressed data produced by the extended LZW processor of the example embodiment conforms to the format of conventional LZW data compression and may be decompressed by a conventional LZW decompression algorithm.

In a linework image with a transparency mask, the character (data byte) zero is present and is encoded more often than any other data value. The example embodiment utilizes this heuristic observation and utilizes a modified LZW compression algorithm, which is optimized for the compression of a series of data byte values equal to zero. The LZW compression algorithm of the example embodiment utilizes a conventional hash table that contains the prefix-character combinations, or data patterns, of a conventional LZW compression algorithm. In the example embodiment, however, an input data prefix-character combination where the next input data character is equal to 0x00 is handled separately and not via hash table processing.

The example embodiment of the present invention handles data characters equal to a predefined data value 0x00 as follows. The example embodiment of the present invention uses an alternative to maintaining the prefix-character combinations in a hash table when processing next character data byte values equal to zero. The example embodiment incorporates a data sequence analyzer which performs, in addition to the conventional LZW processing of the input data, an identification of data input strings where the next character being processed is equal to zero. In the case of a next character having the value of zero, the example embodiment of the present invention performs specialized processing.

The example embodiment comprises a codeword data storage which incorporates dedicated storage to store compressed data codewords that are associated with strings which end in the character zero. Once the data sequence analyzer determines that the currently processed string ends in a zero, the codeword data storage determines if a codeword for that string has been stored. If that codeword has not been stored, the conventional LZW processing is performed to generate the codeword, and the codeword data storage then stores that generated storage for subsequent use. If the codeword for the currently processed string has been stored, the codeword data producer then retrieves that value and produces the stored codeword to the codeword output generator for output as the compressed data codeword. The codeword output generator of the example embodiment receives compressed data codewords by accessing either the hash tables according to the conventional LZW algorithms, or by accepting input from the codeword data producer which accesses compressed data codeword within the codeword data storage. The codeword data storage of the example embodiment uses the COMBINED0[ ] array to contain the information for the prefix-character combination where the next input character is zero. COMBINED0 array has an element for all possible compression output codes which are produced when the next input value is zero and each element of that array is initialized to a predetermined value that is known to not be a valid compression output code (in the example embodiment, the entries in the COMBINED0 array are of the "short integer" data type and are initialized to −1). For every input data stream code that is followed by the zero character, the COMBINED0[code] array element contains the code that describes sequence containing the string 'code' followed by a zero data byte.

As an example of the processing performed for a linework image, which presumably contains a large amount of blank pixels, the image data contains non-zero data followed by a length of data values equal to zero. When the next character of the processing is detected to be a zero, the data located within the array COMBINED0[ ] at the location indexed by the value of the LZW code word for the data string preceeding this zero data character is examined to determine if that value in the COMBINED0 array is equal to −1. If the value is equal to −1, then no code word has been stored in that location, and the resulting code word is generated by the conventional LZW compression algorithm and is stored into the corresponding location of COMBINED0[ ]. If the value stored in that location of COMBINED0[ ] is not equal to −1, the value is retrieved and used as the code word.

Each element in the COMBINED0 array in the example embodiment contains the code that describes the string composed of the string that is described by the index into the array, followed by the zero character. As an example, assume that code "298" describes string 0x37, 0xff, 0xaa, and let the value in the array element COMBINED0[298] be equal to 325. This represents that the code 325 describes the string comprising 0x37, 0xff, 0xaa, 0x00. This modification to the LZW algorithm to process speeds the algorithm considerably by obviating the need to perform the hash table processing for input data sequences equal to zero. Although this processing is practically performed for one or a few characters, such as character "zero," performing this processing for all characters (which would result in requiring the maintenance of 256 "character0" arrays) would require the use of a large amount of memory that could result in memory cache trashing.

The second array used by the example embodiment is called COMBINED1[ ] in the following description and is configured to contain the LZW encoding code word that is associated with a continuous stream of data values that are equal to zero where the length of the continuous stream of zeros is equal to the index value into the array COMBINED1[ ]. For example, the value stored in COMBINED1[x] is equal to the encoding code word for a length of x bytes that contain the value zero. This provides an alternative to following a "len" long chain of combined[0] entries by determining the total length of zero elements in the data to be encoded and simply retrieving the relevant codeword. Each of these two arrays is dimensioned to hold an integer for all the possible output code words. Every time the LZW compression algorithm is restarted in the example embodiment, each array is initialized to −1 in all positions.

The example embodiment also performs specially optimized processing for long string of zeroes. In the example embodiment, the "zeroCodeArray" array contains a complete LZW compressed sequence, 256, 0, 258, . . . , 4093. In this encoding, the initial 256 and 0 are encoded using 9 bits. The whole array occupies 5406 bytes. Assuming a constant character, a part of this array can be copied as a valid datastream.

As an example of the above processing, let N be the number of zeroes to be encoded. Let K be the largest integer such that K<4093 and K*(K+1)/2 is not greater than N. Then K+1 is the last code to be output and the contents of zeroCodeArray can just be copied to the output until the last code is output. The remaining zeroes can either be encoded using the above described algorithm, or an alternative embodiment may determine portions of the zeroCodeArray which are to be output by the encoder.

In the unlikely event that there are more than 7,363,203 zeroes to be encoded, the algorithm outputs the full array and restarts. The remaining zeroes are encoded again using regular blank algorithm.

An example of the processing which combines efficient zero data handling and the mask data, according to an example embodiment of the present invention, is illustrated in the following pseudo-code.

```
zeroSequenceLength=1
COMBINED1[0] = 0
Loop over scanlines
    if current mask scanline is blank
        find the number of blank scanlines following the current one
        advance the line counter over the blank lines
        set nZeroesToEncode to the total number of pixels in the blank lines.
        update the COMBINED1 array if there is a not-yet-recorded sequence
of zeroes encoded in COMBINED0
        run the regular algorithm for zero (i.e., using the combined0 table) until
a new code is issued
        based on COMBINED1, we know then the next code will need to be
issued
        - this gives us delta (which is the number of zeros encoded in the first "all-
zero" string codeword)
        the code sequence for the remaining zeroes is read from the
zeroCodeArray and output
        COMBINED0 and possibly COMBINED1 arrays are updated
        the remaining zeroes are encoded using either regular algorithm or
combined1
    else
        loop over white/black run pairs
            encode white run hardcoding character to 0x00 and using
combined0 instead of hash table
            loop over the characters in the black run
                if character is 0x00
                    encode it using COMBINED0
                else
                    encode it using the regular hash table
            end loop over run pairs
    end if (scanline blank or not)
end loop over scanlines
```

Generating the 8 bit LZW Compressed Data from Transparency Mask for Two-Tone Data The above LZW processing, which is utilized by the example embodiment, performs special processing for blank areas of an image and allows areas which contain grayscale or colors of various intensities to be printed. The example embodiment of the present invention performs specialized processing of image data, which contains only two tones, i.e., where the pixel is either "on" or "off." If the image data consists of only two tones, this results in the situation where the image pixel data contains only the values 0x00 and 0xff. The example embodiment comprises a two-tone image detector which analyzes linework images to determine if the linework image contains only two-tone data. The general LZW algorithm of the example embodiment is modified for further efficiency when processing two-tone image data. In the example embodiment, only the image mask data of a two-tone image is processed and not the actual image data. The processing of the example embodiment utilizes the relationship in two-tone linework image data that all of the pixels where mask bit is 1 have the value 0xff, while all of the pixels where the mask bit is 0 have value of 0x00. If the two-tone image detector determines that the linework image within the current tile is two-tone data, the LZW compression processing of the example embodiment does not utilize a hash table because only two characters can occur in the input data. As an alternative to the using hash tables, the processing of the example embodiment utilizes two arrays, the COMBINED0 and the COMBINEDFF arrays. The COMBINED0 array is as is described above for general linework image data compression. The COMBINEDFF array behaves similarly except that lengths of the 0xff character in the input data stream are encoded through use of the array values instead of conventional LZW processing.

The conventional LZW algorithm encodes a data string that contains all zeros into a compressed datastream containing the value 256 (i.e., start of the image), then the value 0 (the character), then the code 258, then the code 259 and so on. The conventional LZW algorithm skips the code 257 due to that code's special meaning in the LZW algorithm as the image terminator. It can also be noticed that the character itself is never repeated, since it has remained constant. Thus, 258 encodes the string 0,0, 259 encodes the string 0,0,0 and so on.

The example embodiment does not detect blank scan lines when encoding two-tone linework image data. Alternative embodiments may detect blank scan lines within the two-tone linework image data, but since the two-tone linework image data is not directly read, the difference in processing speed is negligible and size of the software code to perform the processing is decreased.

Hardware and Software Implementation

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

NON-LIMITING EXAMPLES

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A method for compressing image data, comprising the steps of:
    identifying a plurality of image tiles within a composite image data set, wherein a mask data value indicating whether the pixel contains one of continuous tone image data or linework image data and a valid data value indicating whether the pixel contains any data at all are associated;
    characterizing an image data group within at least one image tile within the plurality of image tiles as one of linework image data if an aggregation of valid data values associated with pixels within the image data group is equal to true and an aggregation of mask data values associated with pixels within the image data group is equal to false or continuous tone image data; and
    encoding the image data group for at least the one image tile, wherein the image data group is encoded by an encoding algorithm selected based upon the characterization of the image data group.

2. The method according to claim 1, further comprising the step of encoding the composite image data set by an encoding algorithm with run length encoding and runend encoding.

3. The method according to claim 1, wherein the step of characterizing an image data group includes characterizing an image data group as continuous tone image data if an aggregation of mask data values is equal to true.

4. The method according to claim 1, wherein the step of encoding includes encoding by an algorithm selected to be a JPEG encoding algorithm when the image data group is characterized as continuous tone data.

5. The method according to claim 1, wherein the step of characterizing an image data group includes characterizing an image data group as continuous tone data and wherein the image data group comprises a plurality of meta-data indicators that each indicate the presence of data within each pixel of the composite image data and wherein the step of encoding further comprises the sub-steps of:
    determining if the image data group contains blank image data through examination of the plurality of meta-data indicators; and
    returning, in response to a determination of a blank image by the step of determining, an encoded image data set representing a blank image wherein the encoded image data set is generated by assembling a combination of pre-stored compressed data output codewords.

6. The method according to claim 1, wherein the step of encoding includes encoding by an LZW encoding algorithm if the image data group is characterized as linework data.

7. The method according to claim 6, further comprising the step of:
   determining whether the image data group consists of two-tone image data and wherein the step of encoding, in response to a determination that the image data group consists of two-tone image data, produces an LZW formatted output by using arrays containing previously stored codewords corresponding to codewords representing runs of data values within the image data group that are equal to one of 0x00 and 0xff.

8. The method according to claim 6, wherein the step of encoding further comprises the sub-steps of:
   analyzing a sequence of data within the image data group to identify a plurality of data patterns within the sequence of data;
   outputting a codeword that represents each data pattern within the plurality of data patterns;
   storing, in at least one separate data structure, a plurality of codewords wherein each codeword within the plurality of codewords is associated with a different data pattern within the plurality of data patterns, and wherein the data pattern that is associated with each codeword stored in the at least one separate data structure ends with a unique pre-defined data value; and
   retrieving one of the plurality of codewords from the separate data structure upon a subsequent occurrence of a data pattern that ends with the pre-defined data value.

9. The method according to claim 8, wherein the step of storing includes storing codewords that are associated with data patterns that end with the unique pre-defined data value equal to 0x00.

10. The method according to claim 1, wherein the step of identifying a plurality of image tiles further comprises the sub-steps of:
   accumulating a plurality of scan lines that are contained within the composite image data;
   analyzing a division buffer meta-data set, wherein the division buffer meta-data set comprises an accumulation of a mask data value and an accumulation of valid data value that are associated with each column of the plurality of scan lines;
   determining a tile division definition, wherein the tile division definition identifies separate tiles within the plurality of scan lines by identifying at least one run within the accumulation of valid data values, wherein each of the at least one run contain a contiguous set of the accumulation of valid data values that have the same value.

11. The method according to claim 10, wherein the step of accumulating is performed by performing a pixel-by-pixel logical-OR for all pixels in corresponding columns within the plurality of scan lines.

12. An image data compression system, comprising:
   an image tile identifier for identifying a plurality of image tiles within a composite image data set, wherein a mask data value indicating whether the pixel contains one of continuous tone image data or linework image data and a valid data value indicating whether the pixel contains any data at all are associated;
   a tile data characterizer for characterizing an image data group within at least one image tile within the plurality of image tiles as one of linework image data if an aggregation of valid data values associated with pixels within the image data group is equal to true and an aggregation of mask data values associated with pixels within the image data group is equal to false or continuous tone image data; and
   a tile data encoder for encoding the image data group for at least the one image tile, wherein the composite image data set is encoded by an encoding algorithm selected based upon the characterization of the image data group.

13. The system according to claim 12, further comprising a composite image data set encoder for encoding the composite image data set by an encoding algorithm with run length encoding or runend encoding.

14. The system according to claim 12, wherein the tile data characterizer operates by characterizing an image data group as continuous tone image data if an aggregation of mask data values is equal to true.

15. The system according to claim 12, wherein the tile data encoder selects a JPEG encoding algorithm when the image data group is characterized as continuous tone data.

16. The system according to claim 12, wherein the data characterizer has characterized the image data group as continuous tone data and wherein the image data group comprises a plurality of meta-data indicators that each indicate the presence of data within each pixel of the composite image data and wherein the tile data encoder further comprises:
   a blank image detector, wherein the blank image detector determines if the image data group contains blank image data through examination of the plurality of meta-data indicators;
   a blank image data producer for producing, in response to a determination of a blank image by the blank image detector, an encoded image data set representing a blank image whereby the encoded image data set is generated by assembling a combination of pre-stored compressed data output codewords.

17. The system according to claim 12, wherein the tile data encoder selects an LZW encoding algorithm if the image data group is characterized as linework data.

18. The system according to claim 17, further comprising:
   a two-tone image detector for determining whether the image data group consists of two-tone image data and wherein the tile image encoder, in response to a determination that the image data group consists of two-tone image data, produces an LZW formatted output by using arrays containing previously stored codewords corresponding to codewords representing runs of data values within the image data group that are equal to one of 0x00 and 0xff.

19. The system according to claim 17, wherein the tile data encoder further comprises:
   a data sequence analyzer for analyzing a sequence of data within the image data group to identify a plurality of data patterns within the sequence of data;
   a codeword output generator for outputting a codeword that represents each data pattern within the plurality of data patterns;
   a codeword data storage for storing, in at least one separate data structure, a plurality of codewords wherein each codeword within the plurality of codewords is associated with a different data pattern within the plurality of data patterns, and wherein the data pattern that is associated with each codeword stored in the at least one separate data structure ends with a unique pre-defined data value; and
   a codeword data producer for retrieving one of the plurality of codewords from the separate data structure upon a subsequent occurrence of a data pattern that ends with the pre-defined data value.

20. The system according to claim 19, wherein the codeword data storage stores codewords associated with data patterns that end with the unique pre-defined data equal to 0x00.

21. The system according to claim 12, wherein the image tile identifier performs the following functions:
   accumulation, into a division buffer, a plurality of scan lines that are contained within the composite image data;
   analysis of a division buffer meta-data set, wherein the division buffer meta-data set comprises an accumulation of a mask data value and an accumulation of valid data value that are associated with each column of the plurality of scan lines within the division buffer;
   determination of a tile division definition, wherein the tile division definition identifies separate tiles of the scan lines accumulated in the division buffer by identifying at least one run within the accumulation of valid data values, wherein each of the at least one run contain a contiguous set of the accumulation of valid data values that have the same value.

22. The system according to claim 21, wherein the image tile identifier accumulates the plurality of scan lines by performing a pixel-by-pixel logical-OR for all pixels in corresponding columns within the plurality of scan lines.

23. A computer readable medium including computer instructions for compressing image data, the computer instructions comprising instructions for:
   identifying a plurality of image tiles within a composite image data set, wherein a mask data value indicating whether the pixel contains one of continuous tone image data or linework image data and a valid data value indicating whether the pixel contains any data at all are associated;
   characterizing an image data group within at least one image tile within the plurality of image tiles as one of linework image data if an aggregation of valid data values associated with pixels within the image data group is equal to true and an aggregation of mask data values associated with pixels within the image data group is equal to false or continuous tone image data; and
   encoding the image data group for at least one of the at least one image tile, wherein the composite image data set is encoded by an encoding algorithm selected based upon the characterization of the image data group.

24. The computer readable medium according to claim 23, wherein the instructions for encoding includes instructions for encoding by an encoding algorithm with run length encoding and runend encoding.

25. The computer readable medium according to claim 23, wherein the instructions for characterizing an image data group includes instructions for characterizing an image data group as continuous tone image data if an aggregation of mask data values is equal to true.

26. The computer readable medium according to claim 23, wherein the instructions for encoding include instructions for encoding by an algorithm selected to be a JPEG encoding algorithm when the image data group is characterized as continuous tone data.

27. The computer readable medium according to claim 23, wherein the instructions for characterizing an image data group include instructions for characterizing an image data group as continuous tone data and wherein the image data group comprises a plurality of meta-data indicators that each indicate the presence of data within each pixel of the composite image data set and wherein the instructions for encoding further comprise instructions for:
   determining if the image data group contains blank image data through examination of the plurality of meta-data indicators; and
   returning, in response to a determination of a blank image by the instructions for determining, an encoded image data set representing a blank image wherein the encoded image data set is generated by assembling a combination of pre-stored compressed data output codewords.

28. The computer readable medium according to claim 23, wherein the instructions for encoding include instructions for encoding by an LZW encoding algorithm if the image data group is characterized as linework data.

29. The computer readable medium according to claim 28, further comprising instructions for:
   determining whether the image data group consists of two-tone image data and wherein the instructions for encoding, in response to a determination that the image data group consists of two-tone image data, produces an LZW formatted output by using arrays containing previously stored codewords corresponding to codewords representing runs of data values within the image data group that are equal to one of 0x00 and 0xff.

30. The computer readable medium according to claim 28, wherein the instructions for encoding further comprise instructions for:
   analyzing a sequence of data within the image data group to identify a plurality of data patterns within the sequence of data;
   outputting a codeword that represents each data pattern within the plurality of data patterns;
   storing, in at least one separate data structure, a plurality of codewords wherein each codeword within the plurality of codewords is associated with a different data pattern within the plurality of data patterns, and wherein the data pattern that is associated with each codeword stored in the at least one separate data structure ends with a unique pre-defined data value; and
   retrieving one of the plurality of codewords from the separate data structure upon a subsequent occurrence of a data pattern that ends with the pre-defined data value.

31. The computer readable medium according to claim 30, wherein the unique pre-defined data value is equal to 0x00.

32. The computer readable medium according to claim 23, wherein the instructions for identifying a plurality of image tiles further comprise instructions for:
   accumulating a plurality of scan lines that are contained within the composite image data;
   analyzing a division buffer meta-data set, wherein the division buffer meta-data set comprises an accumulation of a mask data value and an accumulation of valid data value that are associated with each column of the plurality of scan lines;
   determining a tile division definition, wherein the tile division definition identifies separate tiles within the plurality of scan lines by identifying at least one run within the accumulation of valid data values, wherein each of the at least one run contain a contiguous set of the accumulation of valid data values that have the same value.

33. The computer readable medium according to claim 32, wherein the instructions for accumulating comprise instructions for performing a pixel-by-pixel logical-OR for all pixels in corresponding columns within the plurality of scan lines.

* * * * *